United States Patent
Yamagishi et al.

(10) Patent No.: US 7,467,916 B2
(45) Date of Patent: Dec. 23, 2008

(54) SEMICONDUCTOR-MANUFACTURING APPARATUS EQUIPPED WITH COOLING STAGE AND SEMICONDUCTOR-MANUFACTURING METHOD USING SAME

(75) Inventors: Takayuki Yamagishi, Tama (JP); Takeshi Watanabe, Tama (JP)

(73) Assignee: ASM Japan K.K., Tokyo (JP)

( * ) Notice: Subject to any disclaimer, the term of this patent is extended or adjusted under 35 U.S.C. 154(b) by 418 days.

(21) Appl. No.: 11/074,820

(22) Filed: Mar. 8, 2005

(65) Prior Publication Data

US 2006/0204356 A1 Sep. 14, 2006

(51) Int. Cl.
*B65G 49/07* (2006.01)
(52) U.S. Cl. ...................... 414/217; 414/805
(58) Field of Classification Search .................. 414/217, 414/217.1, 935, 806, 805; 438/464, 782, 438/908
See application file for complete search history.

(56) References Cited

U.S. PATENT DOCUMENTS

| | | | |
|---|---|---|---|
| 4,592,800 A | 6/1986 | Landan et al. | |
| 4,854,263 A | 8/1989 | Chang et al. | |
| 4,908,095 A | 3/1990 | Kagatsume et al. | |
| 5,145,303 A | 9/1992 | Clarke | |
| 5,178,638 A | 1/1993 | Kaneko et al. | |
| 5,217,559 A | 6/1993 | Moslehi et al. | |
| 5,288,379 A | 2/1994 | Namiki et al. | |
| 5,306,380 A | 4/1994 | Hiroki | |
| 5,365,877 A | 11/1994 | Kubota | |
| 5,382,311 A | 1/1995 | Ishikawa et al. | |
| 5,405,230 A | 4/1995 | Ono et al. | |
| 5,433,784 A | 7/1995 | Miyagi et al. | |
| 5,458,685 A | 10/1995 | Hasebe et al. | |
| 5,685,942 A | 11/1997 | Ishii | |
| 5,730,801 A | 3/1998 | Tepman et al. | |
| 5,752,796 A * | 5/1998 | Muka ...................... 414/217.1 |
| 5,755,888 A | 5/1998 | Torii et al. | |
| 5,855,681 A | 1/1999 | Maydan et al. | |
| 5,909,994 A | 6/1999 | Blum et al. | |
| 5,944,857 A | 8/1999 | Edwards et al. | |
| 6,016,611 A | 1/2000 | White et al. | |
| 6,024,800 A | 2/2000 | Soejima et al. | |
| 6,053,980 A * | 4/2000 | Suda et al. ................... 118/719 |
| 6,143,083 A | 11/2000 | Yonemitsu et al. | |
| 6,235,634 B1 | 5/2001 | White et al. | |
| 6,273,956 B1 | 8/2001 | Cox | |
| 6,382,895 B1 * | 5/2002 | Konishi et al. ............... 414/217 |
| 6,395,094 B1 | 5/2002 | Tanaka et al. | |

(Continued)

FOREIGN PATENT DOCUMENTS

| JP | 10-030183 | 2/1998 |
|---|---|---|
| JP | 10-154739 | 6/1998 |

*Primary Examiner*—Charles A Fox
(74) *Attorney, Agent, or Firm*—Knobbe, Martens, Olson & Bear LLP

(57) ABSTRACT

A wafer transfer apparatus includes: (A) a mini environment that connects to a wafer storage part and a load lock chamber and is equipped with a transfer robot inside, in order to transfer wafers between the wafer storage part and load lock chamber in the presence of air flows; and (B) a cooling stage that opens and connects to the mini environment from the outside of the mini environment in the vicinity of the connection port of the load lock chamber, in order to temporarily hold a wafer so that the wafer is cooled by the air taken in from the mini environment.

8 Claims, 11 Drawing Sheets

U.S. PATENT DOCUMENTS

| | | | |
|---|---|---|---|
| 6,410,455 B1 * | 6/2002 | Kuribayashi et al. | 438/758 |
| 6,481,956 B1 | 11/2002 | Hofmeister | |
| 6,543,981 B1 * | 4/2003 | Halsey et al. | 414/217.1 |
| 6,609,869 B2 * | 8/2003 | Aggarwal et al. | 414/217 |
| 6,696,367 B1 | 2/2004 | Aggarwal et al. | |
| 7,168,911 B1 * | 1/2007 | Wood et al. | 414/804 |
| 2002/0034886 A1 * | 3/2002 | Kurita et al. | 438/800 |
| 2006/0245852 A1 * | 11/2006 | Iwabuchi | 414/217 |

* cited by examiner

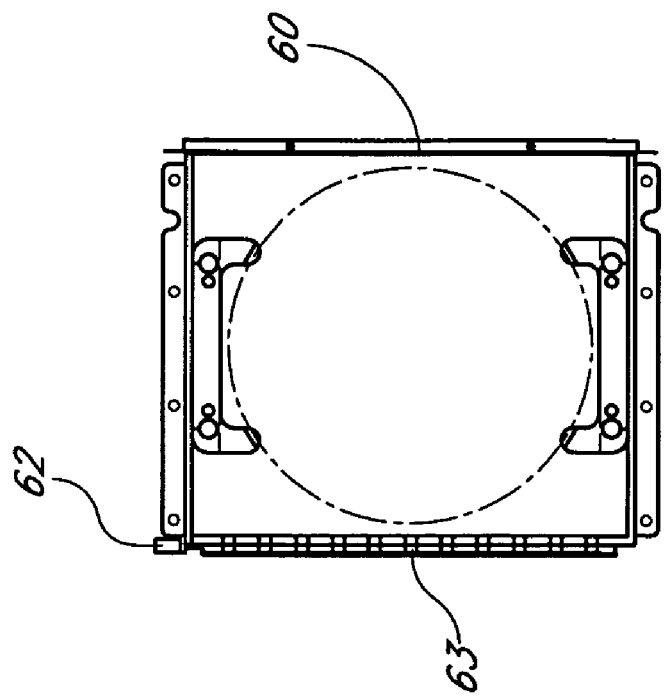
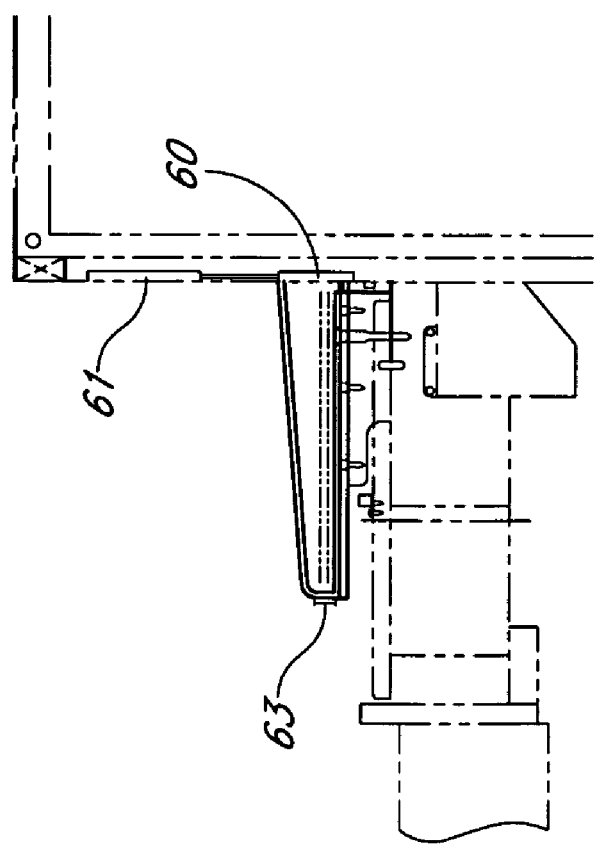
FIG. 6B
FIG. 6A

SEMICONDUCTOR-MANUFACTURING APPARATUS EQUIPPED WITH COOLING STAGE AND SEMICONDUCTOR-MANUFACTURING METHOD USING SAME

BACKGROUND OF THE INVENTION

1. Field of the Invention

The present invention relates to the structure and utilization method of a semiconductor manufacturing apparatus of a single wafer type, which is also a semiconductor manufacturing apparatus of a vacuum-load-lock type, capable of efficiently processing wafers in succession.

2. Description of the Related Art

The film formation temperatures in the reaction chambers of general CVD apparatuses are approx. 400° C. As a result, the wafer temperature after a backfill of the load lock chamber (a step to restore the load lock chamber (IOC) to the atmospheric pressure from a vacuum state via introduction of $N_2$), which occurs following film formation, is still high, or around 200° C. In conventional apparatuses, therefore, wafers must be kept in the load lock chamber, in a dedicated cooling chamber or in other location until the hot wafers cool down to temperatures acceptable to the wafer carrier (approx. 100° C.). This limits the wafer transfer speed and consequently reduces the throughput.

One measure to address this problem is installing a cooling stage inside the mini environment that accommodates the transfer robot. However, it will increase the footprint as a result of a larger mini environment. Another potential solution is to provide a separate cooling fan or utilize cooling water in order to promote the cooling of wafers inside the mini environment. However, this is a costly approach for obvious reasons.

SUMMARY OF THE INVENTION

The present invention was developed to solve the problems stated above. In an embodiment, an object is to provide a wafer transfer apparatus that embodies one or more of the following: low cost, small footprint, small faceprint, and high throughput.

In an embodiment of the present invention, another object is to provide a wafer transfer apparatus that embodies high throughput with a level of stability sufficient for use in the manufacturing process.

In another embodiment, the present invention provides a semiconductor manufacturing apparatus equipped with a wafer transfer apparatus such as those described above.

In yet another embodiment, the present invention provides a method for manufacturing semiconductors by utilizing a semiconductor manufacturing apparatus such as those described above.

According to an embodiment of the semiconductor-manufacturing apparatus which achieves at least one of the objects described above, the present invention provides a wafer transfer apparatus comprising: (A) a mini environment that connects to a wafer storage part and a load lock chamber and is equipped with a transfer robot inside, in order to transfer a wafer between the wafer storage part and load lock chamber in the presence of air flows; and (B) a cooling stage that opens and connects to the mini environment from the outside of the mini environment in the vicinity of (preferably above) a connection port thereof for the load lock chamber, in order to temporarily hold a wafer so that the wafer is cooled by the air taken in from the mini environment; wherein the wafer transfer apparatus is capable of transferring a wafer among the wafer storage part, load lock chamber, and cooling stage by means of the transfer robot.

The above embodiment further includes at least the following embodiments:

The wafer transfer apparatus wherein the cooling stage comprises an air channel and a wafer support that temporarily holds a wafer in the air channel;

The wafer transfer apparatus wherein a slit is provided at an outlet of the air channel on a side opposite to an opening that serves as an inlet of the air channel;

The wafer transfer apparatus wherein an opening of the slit is adjustable;

The wafer transfer apparatus wherein an opening area of the inlet of the air channel is larger than an opening area of an outlet of the air channel;

The wafer transfer apparatus wherein a gate valve is provided at an opening of an inlet of the air channel;

The wafer transfer apparatus wherein a gate valve is provided at an outlet of the air channel on a side opposite to an opening that serves as an inlet of the air channel;

The wafer transfer apparatus wherein the wafer support has a structure that allows multiple wafers to be stacked on top of one another at a specified interval;

The wafer transfer apparatus wherein the cooling stage is positioned on an axis of a connection position on the load lock chamber so that a wafer can be transferred between the cooling stage and load lock chamber with the transfer robot without changing its vertical axis;

The wafer transfer apparatus wherein the mini environment is equipped, below the transfer robot, with a damper with an adjustable angle for adjusting an air flow rate;

The wafer transfer apparatus wherein the cooling stage is further equipped with a retainer member and supported on a top face of the load lock chamber by means of the retainer member.

According to any one of the embodiments specified above, the cooling chamber is positioned above the load lock chamber and is therefore able to take in air from the mini environment (a desirable embodiment is one where a separate cooling means is made unnecessary by simply utilizing air taken from the mini environment), consequently achieving low cost, small footprint and/or small faceprint. In a different embodiment, the cooling chamber is positioned near the load lock chamber so that wafers can be transferred between the cooling chamber and load lock chamber with the transfer robot making no or minimal lateral movements. In such an embodiment, the cooling chamber also functions as a wafer stage and can be used as a wafer buffer. In this sense, this embodiment embodies high throughput.

The above embodiments all relate to a wafer transfer apparatus, but the present invention is not limited to wafer transfer apparatuses. Specifically, the present invention also provides semiconductor manufacturing apparatuses that utilize a wafer transfer apparatus. According to another embodiment, the present invention provides a wafer transfer apparatus that comprises: (A) a load lock chamber connected to a reaction chamber; (B) a wafer cassette that stores wafers; (C) a mini environment that connects the wafer cassette and load lock chamber and is equipped with a transfer robot inside; and (D) a cooling stage positioned near (and preferably above) the load lock chamber and opening to the mini environment to take in air from the mini environment; wherein (E) the wafer transfer apparatus is capable of transferring wafers among the wafer cassette, load lock chamber and cooling stage by means of the transfer robot.

According to yet another embodiment, the present invention provides a semiconductor manufacturing apparatus that comprises: (A) a reaction chamber; (B) a transfer chamber connected to the reaction chamber; (C) a load lock chamber connected to the transfer chamber; (D) any one of the foregoing wafer transfer apparatus connected to the load lock chamber and equipped with the mini environment and the cooling stage; and (E) a wafer storage part connected to the wafer transfer apparatus.

The aforementioned embodiments can further include at least the following embodiments:

The semiconductor manufacturing apparatus wherein the transfer chamber is positioned below the reaction chamber;

The semiconductor manufacturing apparatus wherein the reaction chamber and load lock chamber are positioned on an outer periphery of the transfer chamber.

In the above wafer manufacturing apparatuses and semiconductor manufacturing apparatuses, a given requirement in one embodiment is interchangeable with another requirement in a different embodiment, and individual requirements in different embodiments can also be combined. The present invention is not limited to the above embodiments, but it instead encompasses other embodiments that are able to achieve one or more of the objects described above or other objects.

The present invention is also applicable to manufacturing methods, just as it is applicable to wafer transfer apparatuses and semiconductor manufacturing methods. In yet another embodiment, the present invention provides a semiconductor manufacturing method that comprises: a) a step of returning a wafer on which a film has been formed in the reaction chamber to the load lock chamber; b) a step of transferring the wafer from the load lock chamber to the mini environment after the load lock chamber is restored to the atmospheric pressure, and then to the cooling stage by means of the transfer robot; c) a step of introducing a next wafer from the wafer storage part to the mini environment and then to the load lock chamber by means of the transfer robot; d) a step of transferring the next wafer from the load lock chamber to the reaction chamber for formation of film on the wafer; e) a step of transferring the wafer in the cooling stage to the mini environment and then to the wafer storage part by means of the transfer robot; and f) a step of repeating steps a) through e) for each subsequent wafer. FIG. 8 illustrates an example of the above steps.

In the above embodiment, one wafer is stored in the cooling stage and transferred. It should be noted, however, that the present invention is not limited to this design. For example, in yet another embodiment, the present invention provides a semiconductor manufacturing method that utilizes one of the aforementioned wafer transfer apparatuses and is capable of storing two wafers in the cooling stage; wherein the aforementioned semiconductor manufacturing method comprises: a) a step of returning a first wafer on which a film has been formed in the reaction chamber to the load lock chamber; b) a step of transferring the first wafer from the load lock chamber to the mini environment after the load lock chamber is restored to the atmospheric pressure, and then to the cooling stage by means of the transfer robot; c) a step of introducing a second wafer from the wafer storage part to the mini environment and then to the load lock chamber by means of the transfer robot; d) a step of transferring a second wafer from the load lock chamber to the reaction chamber for formation of film on the wafer; e) a step of returning the second wafer on which a film has been formed in the reaction chamber to the load lock chamber; f) a step of transferring the second wafer from the load lock chamber to the mini environment after the load lock chamber is restored to the atmospheric pressure, and then to the cooling stage by means of the transfer robot; g) a step of introducing a third wafer from the wafer storage part to the mini environment and then to the load lock chamber by means of the transfer robot; h) a step of transferring the third wafer from the load lock chamber to the reaction chamber for formation of film on the wafer; i) a step of transferring the first wafer in the cooling stage to the mini environment and then to the wafer storage part by means of the transfer robot; and j) a step of repeating steps e) through i) for each subsequent wafer. FIG. 9 illustrates an example of the above steps.

In the above embodiment, two wafers are stored in the cooling stage and transferred. It should be noted, however, that the present invention is not limited to this design, and three or more wafers can also be operated in a similar procedure.

It is also possible to utilize the cooling stage as a wafer stage. In yet another embodiment, the present invention provides a semiconductor manufacturing method that utilizes one of the aforementioned wafer transfer apparatuses and is capable of storing two wafers in the cooling stage; wherein the aforementioned semiconductor manufacturing method comprises: a) a step of introducing an unprocessed wafer from the wafer storage part to the cooling stage by means of the transfer robot; b) a step of returning a processed wafer on which a film has been formed in the reaction chamber to the load lock chamber; c) a step of transferring the processed wafer from the load lock chamber to the mini environment after the load lock chamber is restored to the atmospheric pressure, and then to the cooling stage by means of the transfer robot; d) a step of transferring the unprocessed wafer from the cooling stage to the mini environment and then to the load lock chamber by means of the transfer robot; e) a step of transferring the unprocessed wafer from the load lock chamber to the reaction chamber for formation of film on the wafer; f) a step of introducing a next unprocessed wafer from the wafer storage part to the cooling stage by means of the transfer robot; g) a step of transferring the processed wafer in the cooling stage to the mini environment and then to the wafer storage part by means of the transfer robot; and h) a step of repeating steps b) through g) for each subsequent wafer. FIG. 10 illustrates an example of the above steps.

In one embodiment conforming to any one of the aforementioned manufacturing methods, the air flow rate on a wafer surface in the cooling stage is approx. 1 m/s or more.

As explained above, high throughput with a level of stability sufficient for use in the manufacturing process can be embodied through utilization of the cooling stage proposed by the present invention.

In the above explanation, a given requirement in one embodiment is interchangeable with another requirement in a different embodiment, and individual requirements in different embodiments can also be combined. The present invention is not limited to the above embodiments, but it instead encompasses other embodiments that are able to achieve one or more of the objects described above or other objects.

BRIEF DESCRIPTION OF THE DRAWINGS

The present invention is further explained below with reference to drawings. It should be noted, however, that the present invention is not limited to these drawings. It should also be noted that the drawings are oversimplified for illustrative purposes.

FIG. 5B is a rear view of the same structure (the cooling stage on the right has no retainer grooves), while

FIG. 6A is a side view showing the structure of a cooling stage with gate valves according to an embodiment of the present invention, while FIG. 6B is a plan view of the same structure.

FIG. 7A shows the variable louver in a fully open state, FIG. 7B shows the variable louver in a partially open state, and FIG. 7C shows the variable louver in a fully closed state.

Figure 1:
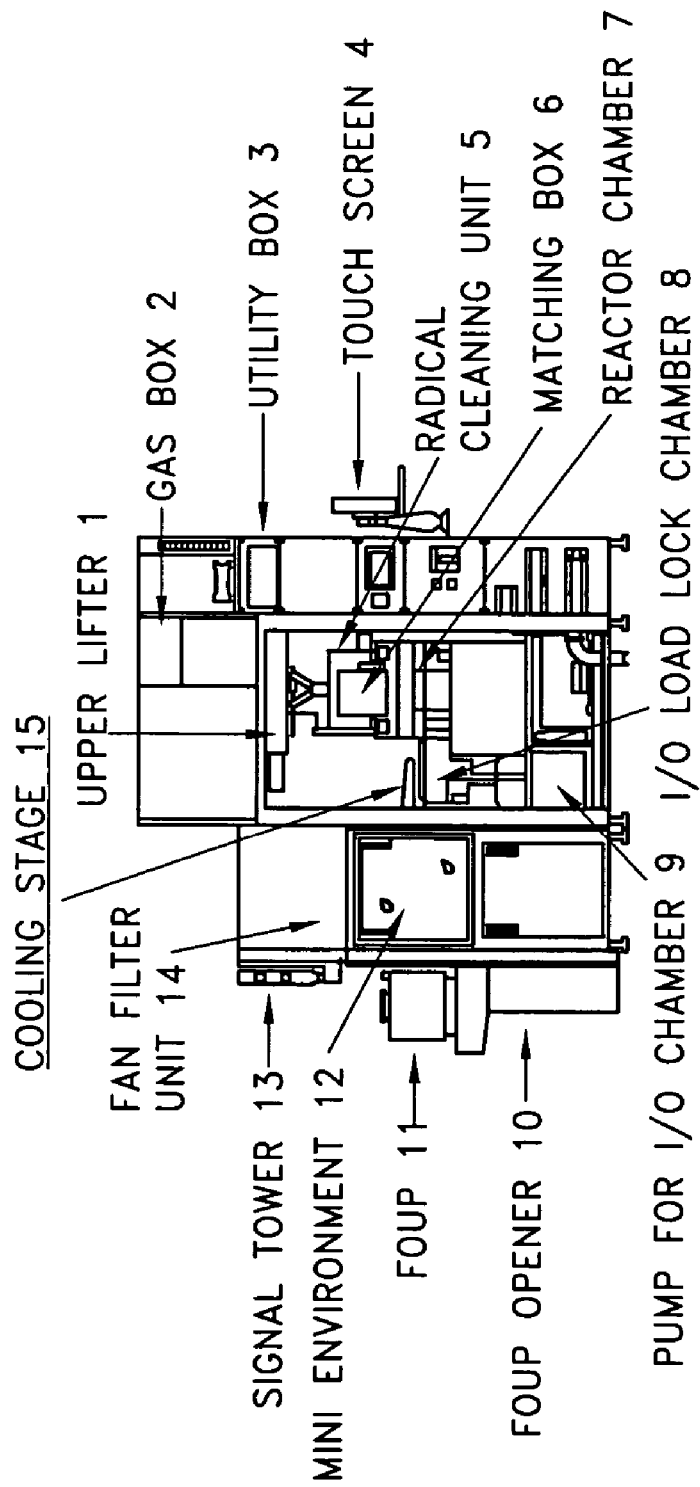
FIG. 1 is a schematic diagram showing a CVD film formation apparatus with a cooling stage according to an embodiment of the present invention.

Explanation of the symbols: 1: Upper lifter, 2: Gas box, 3: Utility box, 4: Touch screen, 5: Radical cleaning unit, 6: Matching box, 7: Reaction chamber, 8: I/O load lock chamber, 9: Pump for I/O chamber, 10: FOUP opener, 11: FOUP, 12: Mini environment, 13: Signal tower, 14: Fan filter unit, 15: Cooling stage, 20: Pre-filter, 21: Fan, 22: ULPA filter, 23: Buffer plate, 24: FE robot, 25: Adjustable dampers, 40: Set plate, 41: Wafer, 42: Adjustable louver, 43: Cooling-stage retainer plate, 50: Retainer groove, 51: 10C gate valve, 60: Front gate valve, 61: Gate-valve open/close air cylinder, 62: Gate-valve open/close air cylinder, 63: Rear gate valve, 71: Variable louver guide, 72: Variable louver screw, 73: Variable louver hole, 110: Load lock chamber, 111: Transfer chamber, 112: Vacuum robot

DETAILED DESCRIPTION OF THE PREFERRED EMBODIMENT

Embodiments of the present invention are explained below by referring to the drawings. It should be noted, however, that the present invention is not limited to these drawings and embodiments.

Figure 3:
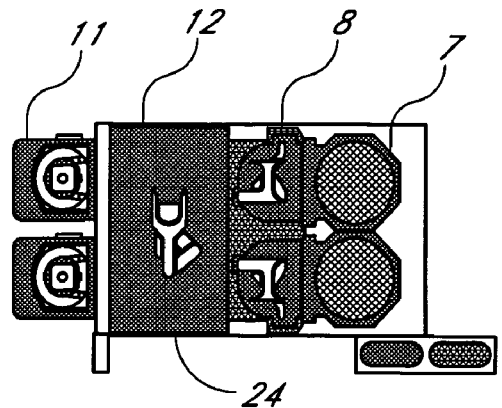
FIG. 3 is a plan section view showing one example of CVD film forming apparatus to which a cooling stage can be installed according to an embodiment of the present invention.

As mentioned above, the invention pertaining to the present application for patent encompasses various embodiments and can be used widely in CVD film formation apparatuses. FIG. 1 shows a CVD film formation apparatus with cooling stage according to an embodiment of the present invention. This embodiment is a semiconductor manufacturing apparatus of the vacuum-load-lock type, comprising a transfer chamber and a reaction chamber (normally a transfer chamber is positioned below a reaction chamber, and both chambers together are referred to as a reaction chamber) 7, a mini environment 12, and a load lock chamber 8 connecting the reaction chamber 7 and the mini environment 12, wherein the mini environment 12 is equipped with a transfer robot (atmospheric pressure robot) 24 (see FIG. 3) so that wafers can be transferred between the transfer robot 24 and various chambers. The mini environment 12 is also connected to an FOUP (Front Opening Unified Pod; a general wafer cassette that stores 300-mm wafers) 11 so that wafers can be transferred between the FOUP 11 and load lock chamber 8 by means of the transfer robot 24. In this embodiment, the mini environment 12 refers to a clean environment having an FFU (Fan Filter Unit) 14 on top. The FOUP 11 may be a simple wafer cassette (the storable wafers need not be 300 mm in size).

As for other parts of the structure, an FOUP opener 10 that opens and closes the FOUP 11 is provided underneath the FOUP, while a signal tower 13 is positioned on a side face of the FFU 14 to indicate the condition of the apparatus. For example, this signal tower can be designed in such a way that a red lamp will turn on if an alarm occurs (apparatus failure), a blue lamp will be lit while the apparatus is standing by prior to lot processing, a yellow lamp will turn on when lot processing is completed, a green lamp will be lit while lot processing is in progress, and so on. Located above the reaction chamber 7 is a matching box 6 that adjusts the impedance by applying RF power to the reaction chamber. A radical cleaning unit 5, which is a remote plasma chamber, is also provided to clean the interior of the reaction chamber (RC) 7. On top of the radical cleaning unit 5, there are a gas box 2 and a utility box 3. In addition, an upper lifter 1 is provided so that the shower head can be suspended at the upper lifter during RC maintenance to be moved in the forward or backward direction in accordance with the location that requires servicing. A touch screen 4 for controlling the CVD apparatus is provided on the front side of the apparatus. The above is only one example and the present invention is not limited to this structure.

In the above embodiment, a cooling stage 15 is installed above (directly above, in this example) the load lock chamber 8 so that air in the mini environment 12 can be taken in to cool the wafers.

Figure 2:
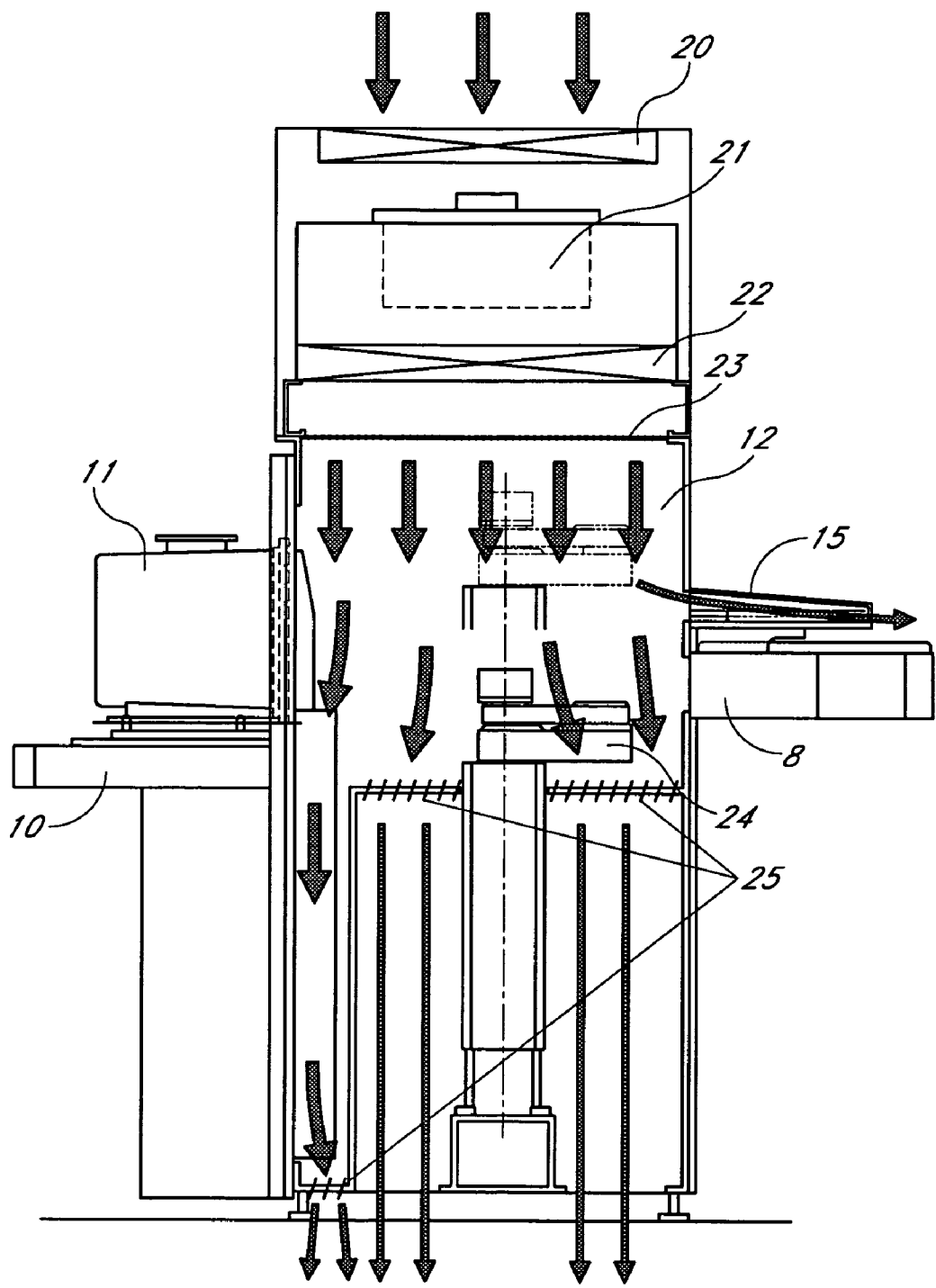
FIG. 2 is a partial section view showing the structure of and around a mini environment with a cooling stage as well as flows of air inside the mini environment according to an embodiment of the present invention.

FIG. 2 is a partial section view showing the structure of and around a mini environment (M/E) 12 with cooling stage as well as flows of air inside the mini environment according to an embodiment of the present invention. The fan filter unit above the M/E 12 comprises a sirocco fan 21 and a ULPA filter 22 and is designed to take in air from the top of the FFU via a pre-filter 20. The air is cleaned via the ULPA filter, and then supplied into the M/E via a buffer plate 23. Adjustable louvers (dampers) 25 are installed below the M/E 12 to exhaust air and adjust the pressure inside the M/E 12. In other words, air is constantly flowing from top to bottom inside the MIE 12.

One example of the environment of this M/E 12 is given below.

Temperature (=room temperature): Approx. 25° C. (alternatively, no temperature adjustment)

Air velocity: Approx. 0.5 m/s±0.1 m/s (in one embodiment, between approx. 0.1 m/s and approx. 1.5 m/s, preferably between approx. 0.3 m/s and approx. 1.0 r/s)

Air volume: Approx. 16 m$^3$/m±3 m$^3$/m

Pressure: Approx. 4.0 Pa±0.8 Pa (in one embodiment, between approx. 2 Pa and approx. 8 Pa (gauge pressure))

The above ranges, especially the range of air volume, will vary depending on the volume of the M/E. These values can also be adjusted by means of the variable louvers 25 in order to adjust the wafer cooling capacity.

In this embodiment, a cooling stage 15 is positioned above the load lock chamber 8 and opened to the M/E 12 so that air inside the M/E is take into the cooling stage 15. Air can be taken into the cooling stage because the pressure inside the M/E is higher than the outside air pressure (no separate air blower or similar device is required). This cooling stage 15 can store two wafers on top of each other, but the present invention is not limited to this design.

After a film is formed on a wafer inside the reaction chamber, the wafer is returned to the load lock chamber, after which the load lock chamber is restored to the atmospheric pressure and then the wafer is returned to the FOUP. Since the wafer temperature is still around 200° C. immediately after the load lock chamber has been restored to the atmospheric pressure, the wafer cannot be returned to the FOUP right away. In this embodiment, the wafer is placed in the cooling stage 15 first and held there for a while so that another wafer can be transferred from the FOUP into the load lock chamber. The transfer sequence involving the cooling stage will be explained later.

An example of the temperature and velocity of air entering the cooling stage 15 from the M/E 12 (air passing over the wafer stored in the M/E; i.e., cooling stage environment) is given below.

Temperature (near the outlet): Approx. 60° C.±10° C. (in one embodiment, between approx. 40° C. and approx. 80° C.)

Air velocity: Approx. 1.7 m/s±0.4 m/s (in one embodiment, between approx. 1 m/s and approx. 5 m/s) (1.5 to 6 times, or preferably 2 times to 4 times the air velocity in the M/E)

The outlet temperature will vary depending on the temperature of the wafer at the time the wafer is stored into the cooling stage. Once the wafer is stored in the cooling stage 15, heat is efficiently removed from the surface of the wafer by means of clean air flowing over the wafer surface.

As explained above, providing a cooling stage improves the wafer processing capacity and increases the throughput. The reasons are considered as follows (it should be noted that the present invention is not limited to those accounted for by these reasons). In one embodiment, for example, air may be forcibly supplied to the wafer surface, which improves the heat transfer efficiency on the wafer surface and shortens the cooling time itself. Also, the transfer speed does not have to be limited. Specifically, it takes a shorter time to transfer a wafer to the cooling stage located, for example, immediately above the load lock chamber after film has been formed on the wafer, than to return the wafer directly to the FOUP (wafer cassette). Furthermore, after elapse of a specified time (such as 60 seconds), the wafer stored in the cooling stage can be returned to the FOUP (cassette) whenever the robot is idle. This prevents the transfer speed from being limited. The steps to prevent the transfer speed from being limited will be explained later.

Next, the structures of cooling stages in some embodiments are explained. It should be noted, however, that the present invention is not limited to these embodiments.

Figure 4A:
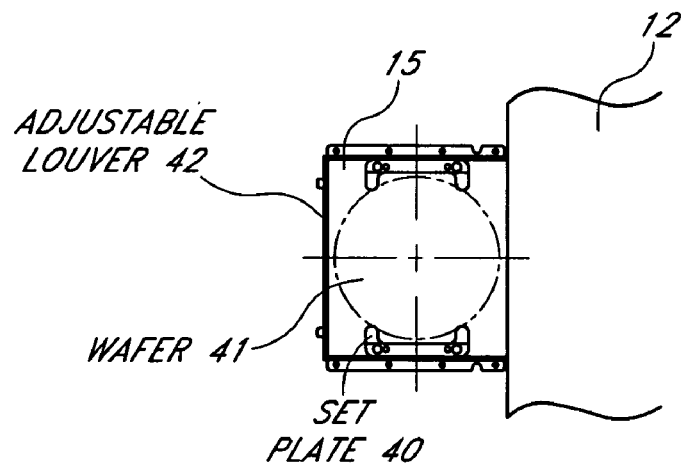
FIG. 4A is a plan section view showing the structure of a cooling stage with a variable louver according to an embodiment of the present invention.
Figure 4B:
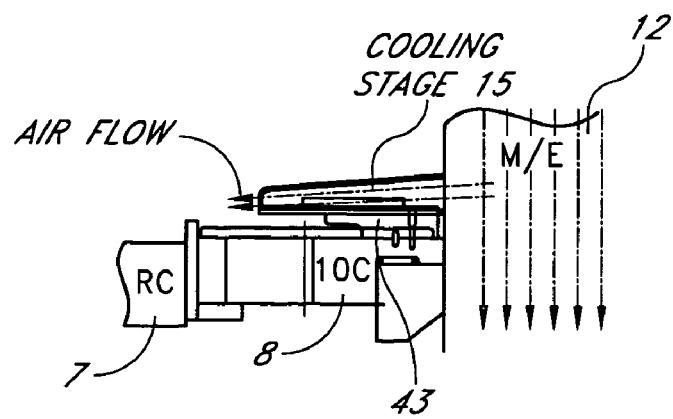
FIG. 4B is a side view of the cooling stage in an installed state.

FIG. 4A is a plan section view showing the structure of a cooling stage (capable of storing two wafers) with a variable louver according to an embodiment of the present invention. FIG. 4B is a side view of aforementioned cooling stage in an installed state. In this embodiment, the cooling stage 15 is secured on the load lock chamber 8 using a cooling-stage retainer plate 43. Also, the connection port on the side wall of the M/E 12 to which the cooling stage 15 is connected is sealed with foamed sponge (EPDM). The cooling stage 15 need not be positioned directly above the load lock chamber 8. However, it should ideally be located near the gate valve on the load lock chamber 8 so that wafers can be transferred between the chambers with the minimum movements of the transfer robot. A layout in which the cooling stage 15 is positioned directly above the load lock chamber 8, where the gate valve on the load lock chamber 8 and the opening in (connection port on) the cooling stage 15 are aligned with the rotating axis (vertical axis) of the transfer robot, is preferred because wafers can be transferred between the load lock chamber 8 and cooling stage 15 with only the vertical movements of the transfer robot and thus the transfer time can be reduced.

The cooling stage 15 can be made of plastics offering transparency and heat resistance (one example is polycarbonate whose thermal deformation temperature is 137° C. to 142° C.). However, the material is not limited to plastics, and aluminum and other metals may be used to construct the cooling stage. The size of the cooling stage 15 should be such that a wafer 41 will not contact the interior walls of the cooling stage as it is transferred into and out of the cooling stage. Desirably, the volume of the cooling stage should be minimized. For example, in a cooling stage 15 that stores one or two wafers, the size of the connection port on (opening in) the M/E 12 may be adjusted to a level equivalent to the gate valve on the load lock chamber. A set plate 40 is attached inside the cooling stage 15 to support wafers. This set plate 40 can be made of aluminum (A6061), for example.

It is desirable that the air outlet of the cooling stage be made smaller than the connection port (air inlet) on the M/E 12. By this way, the air velocity on the wafer surface can be improved efficiently. In the embodiment illustrated by FIGS. 4A and 4B, a variable louver 42 is installed at the air outlet in such a way that its angle can be adjusted. The air velocity (cooling speed) can be adjusted by means of adjusting the louver angle.

Figure 7A:
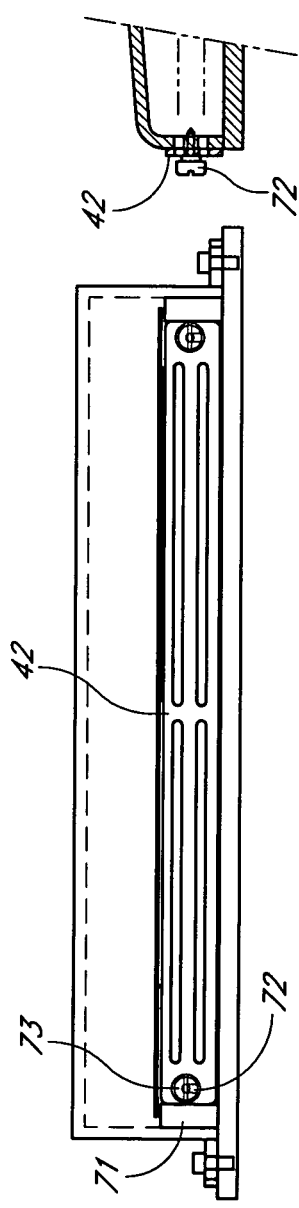
FIGS. 7A, 7B and 7C show an example of a variable louver used in a cooling stage according to an embodiment of the present invention.
Figure 7B:
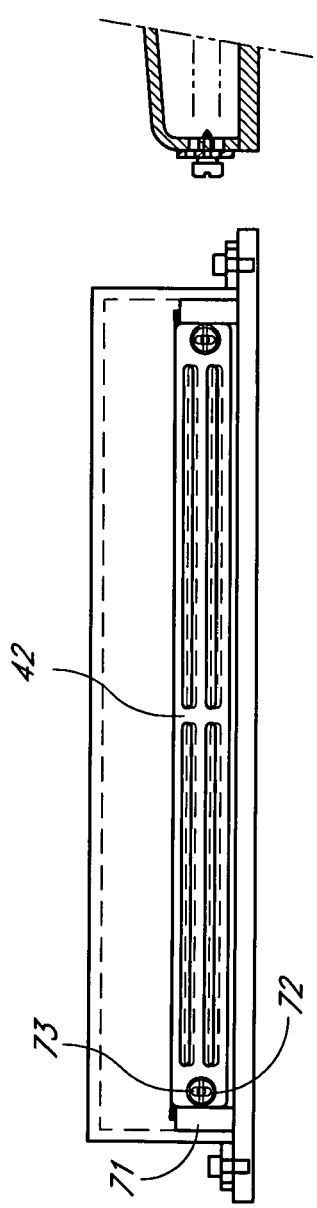
Figure 7C:
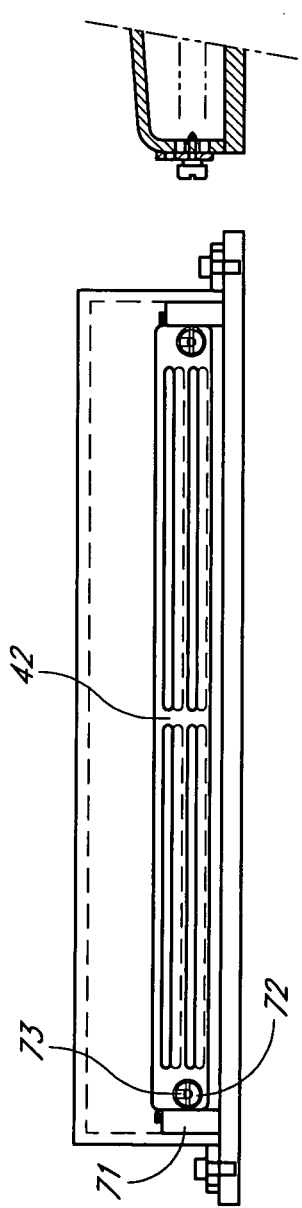
Figure 8A:
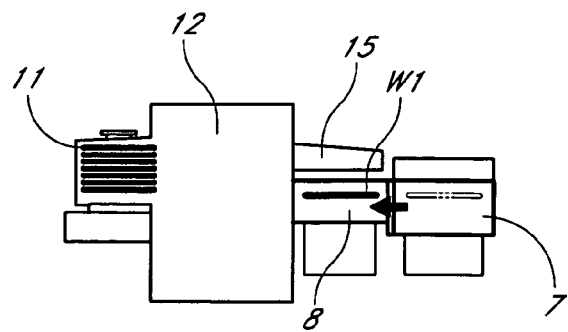
FIG. 8 shows a wafer transfer sequence involving a cooling stage for storing one wafer according to an embodiment of the present invention.
Figure 8B:
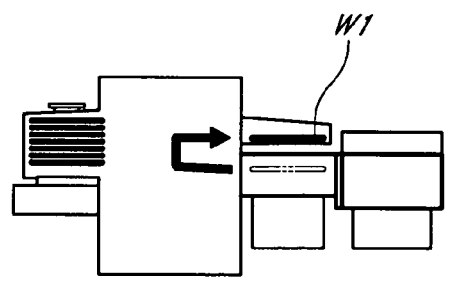
Figure 8C:
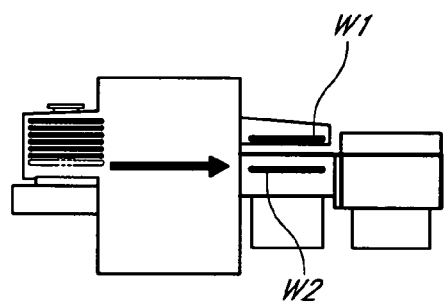
Figure 8D:
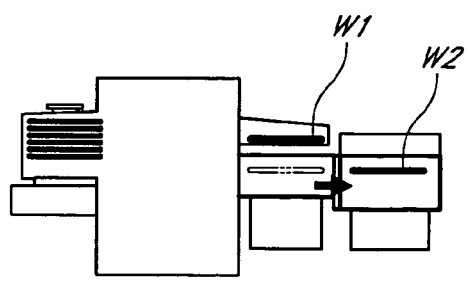
Figure 8E:
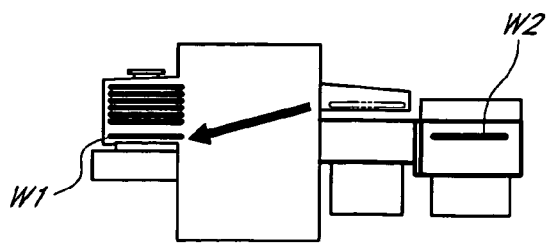
Figure 9A:
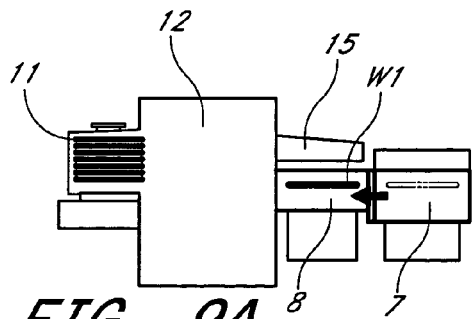
FIG. 9 shows a wafer transfer sequence involving a cooling stage capable of storing two wafers according to an embodiment of the present invention.
Figure 9F:
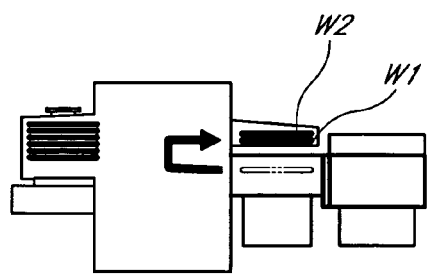
Figure 9B:
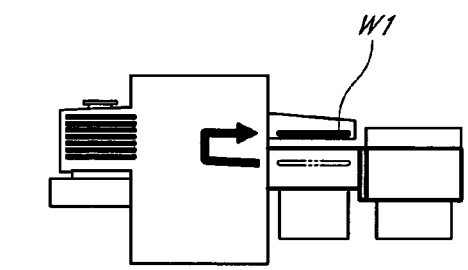
Figure 9G:
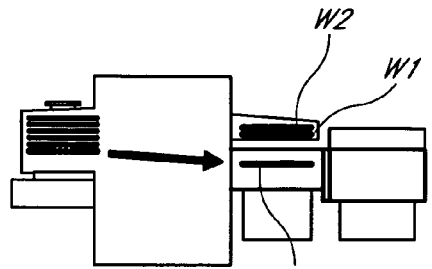
Figure 9C:
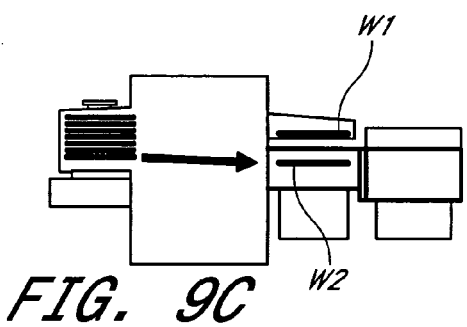
Figure 9H:
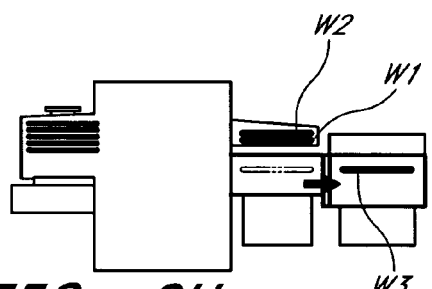
Figure 9D:
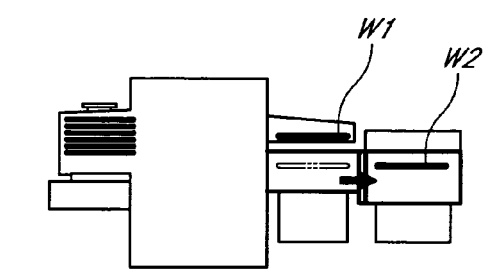
Figure 9I:
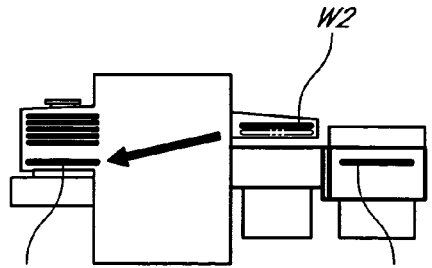
Figure 9E:
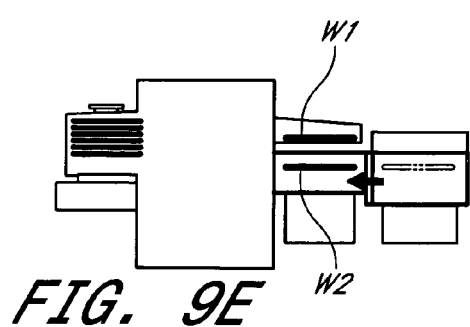
Figure 10A:
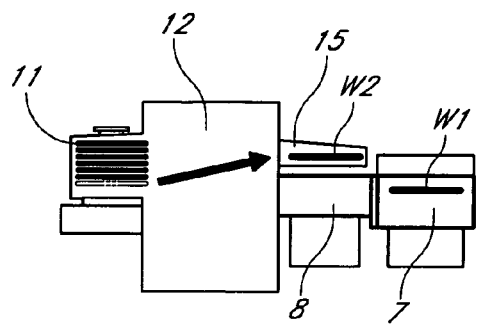
FIG. 10 shows another wafer transfer sequence involving a cooling stage capable of storing two wafers according to an embodiment of the present invention.
Figure 10E:
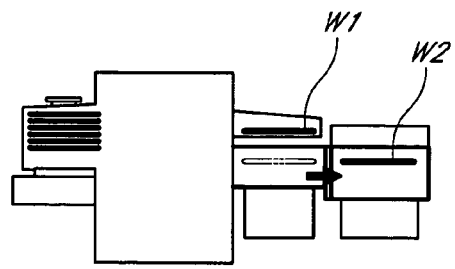
Figure 10B:
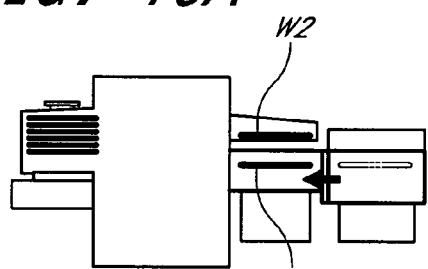
Figure 10F:
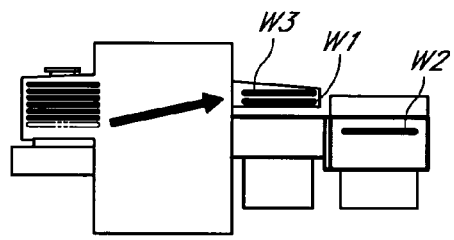
Figure 10C:
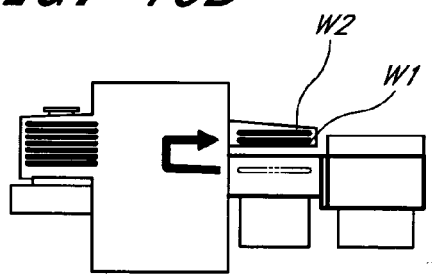
Figure 10G:
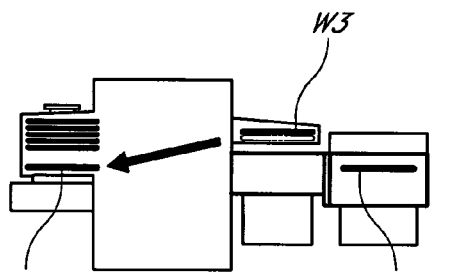
Figure 10D:
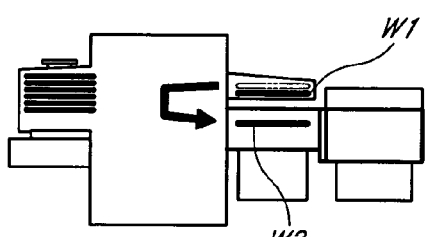

FIGS. 7A, 7B and 7C show an example of cooling stage (capable of storing two wafers) with a variable louver. The variable louver 42 is secured to the cooling stage using two variable louver screws 72 via a variable louver guide 71. Variable louver holes 73 are provided in the variable louver 42 and the variable louver screws 72 are inserted into these holes to secure the variable louver. Since the variable louver holes 73 in the variable louver 42 are longer than they are wide, these holes can be used to adjust the vertical position of the variable louver. The variable louver 42 and variable louver guide 71 (or the air outlet surface of the cooling stage) each have a slit. By moving the variable louver vertically, the overlap of the slits can be adjusted to change the louver angle. FIG. 7A shows the variable louver 42 in a fully open state, FIG. 7B shows the variable louver in a partially open state, and FIG. 7C shows the variable louver in a fully closed state.

Figure 5A:
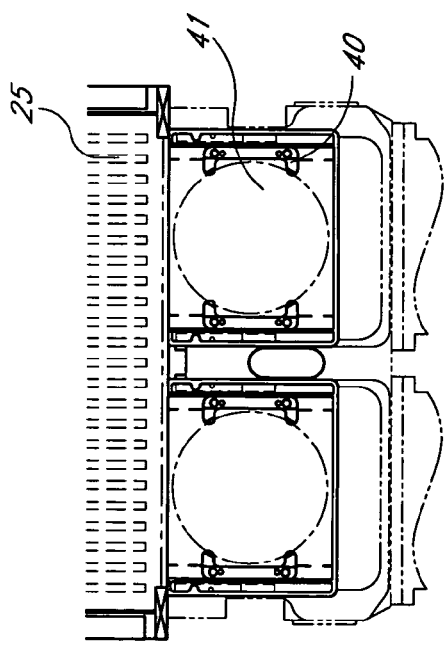
FIG. 5A is a plan section view showing the structure of a cooling stage with retainer grooves according to an embodiment of the present invention.
Figure 5B:
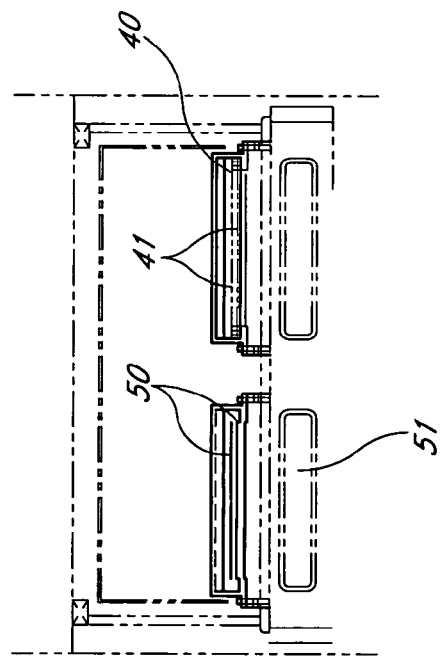
Figure 5C:
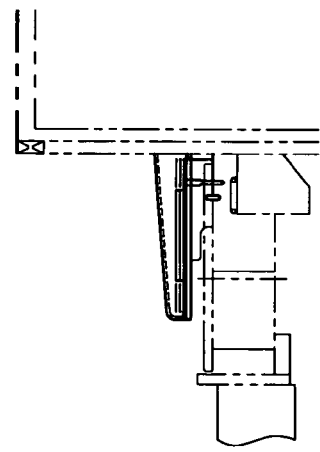
FIG. 5C is a side view showing the same structure.

The variable louver need not be provided. FIG. 5A is a plan section view showing the structure of a cooling stage (capable of storing two wafers) with retainer grooves according to an embodiment of the present invention. FIG. 5B is a rear view of the same structure (the cooling stage on the right has no retainer grooves), while FIG. 5C is a side view showing the same structure. In this embodiment, two levels of retainer grooves 50 are provided at the air outlet. FIG. 5B also illustrates a position relationship with respect to the gate valve 51 on the load lock chamber.

Normally, the opening area of the connection port (air inlet) is larger than the opening area of the air outlet. However, the area ratio is not limited to a specific value and should be adjusted to an appropriate level at which the air velocity can be achieved on the wafer surface. In one embodiment, the opening area ratios may be adjusted to a range of approx. 2:1 to approx. 50:1, or preferably to a range of approx. 10:1 to approx. 30:1.

It is also possible to install a gate valve at the air outlet. FIG. 6A is a side view showing the structure of a cooling stage (capable of storing two wafers) with gate valves according to an embodiment of the present invention, while FIG. 6B is a plan view of the same structure. A front gate valve 60 and a gate-valve open/close air cylinder 61 that opens and closes the front gate valve are provided on the connection port side, while a rear gate valve 63 and a gate-valve open/close air cylinder 62 that opens and closes the rear gate valve are installed on the air outlet side. The gate valves remain "open" in a normal condition. If the FFU shuts down due to power outage, etc., the gate valves will close to protect the wafers from contaminated air that may otherwise come in contact with the wafers during the period of non-operation of the FFU.

The top face of the cooling stage should ideally be inclined from the air inlet toward the outlet. This way, the air velocity rises toward the air outlet. Although the angle of inclination should be selected as deemed appropriate in accordance with the size of wafer and the specified area ratio of inlet and outlet openings, in one embodiment the angle of inclination may be adjusted to a range of approx. 2° to approx. 20°, or preferably to a range of approx. 5° to approx. 10°.

The cooling stage may have only one level or it can have two or more levels. A desired number of wafers stored in the cooling stage can be selected in accordance with the film formation time. In other words, the cooling stage may need to store only one wafer if the film formation time is long (since the cooling effect takes place while film is being formed, there is no need to use the cooling stage as a buffer). If the film formation time is short, however, preferably the cooling stage should be able to store two, three or more wafers and the cooling stage should be used as a buffer. In short, a desired number of wafers can be selected as long as the transfer speed is not limited. Normally, the number of wafers stored in the cooling stage increases as the number of wafers stored in the load lock chamber increases. It is also possible to provide one cooling stage for two or more load lock chamber, in which case it is desirable that the cooling stage be able to store multiple wafers. When multiple wafers are stored in the cooling stage, these wafers may be arranged on top of one another or side by side. Since the air volume is relatively large, the number of wafers stored in the cooling stage has minimal impact on the cooling time.

In one embodiment, the target cooling time may be set so that approx. 60 seconds (in an embodiment, 30 seconds, 50 seconds, 70 seconds, 90 seconds, 120 seconds, or any other duration in between) will be required to reduce the wafer temperature to 100° C. or below. If the target cooling time is approx. 60 seconds, it means the cooling time per wafer is 30 seconds if two wafers are stored, or 60 seconds if only one wafer is stored.

Cooling wafers is not the only purpose of the cooling stage. The cooling stage can also be used simply as a wafer stage on which wafers are placed. For example, only one wafer may need to be placed in the cooling stage when the film formation time is long (the transfer speed is not limited). In this case, the upper stage (if the cooling stage can store two wafers) can be used as a wafer stage. Specifically, after the robot has transferred a wafer from the FOUP to the load lock chamber, the remaining time can be used to transfer the next wafer from the FOUP to the wafer stage in advance. This way, the time required to exchange wafers in the load lock chamber can be reduced. For example, the time required by the robot to access the; FOUP to take a wafer can be reduced in this embodiment, because after the robot returns a wafer on which film has been formed from the load lock chamber to the cooling chamber, it only needs to take a pre-placed wafer from the wafer stage directly above and place it into the load lock chamber. This switching of cooling stage function from "cooling stage" to "wafer stage" can be implemented by software with ease.

Figure 11:
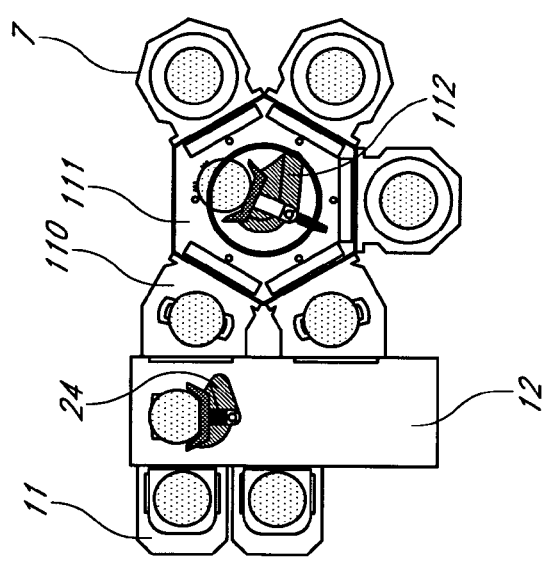
FIG. 11 is a section view showing a cluster CVD film formation apparatus to which a cooling stage can be installed according to an embodiment of the present invention.

The cooling stage may be installed on a general cluster tool, as shown in FIG. 11. This cluster tool has multiple reaction chambers 7 and multiple load lock chambers 110 around a transfer chamber 7. A vacuum robot 112 is provided inside the transfer chamber 111 so that wafers can be transferred among the chambers. In this case, it is desirable that the cooling stage be positioned above the load lock chambers 110.

As explained earlier, one embodiment can be considered that adopts a structure whereby clean air is introduced to the M/E from an AFE (Atmospheric Front End), passed through the cooling stage provided above the load lock chamber, and then exhausted to the apparatus side, and wafers are set along this air channel for cooling. The cooling stage may be provided below the load lock chamber. If the cooling stage is provided below the load lock chamber, the air intake efficiency will drop, but it will become possible to select an appropriate cooling stage position in accordance with the apparatus and its environment. Additionally, it is also be possible to install the cooling stage not on the same surface as the gate valve on the load lock chamber, but on a facing surface or adjacent surface. In this case, however, the transfer efficiency may be compromised.

Next, examples of different transfer sequences, each involving a cooling stage, are explained.

FIG. 8 shows a wafer transfer sequence involving a cooling stage for storing one wafer as proposed in one embodiment. To be specific, this sequence presents a semiconductor manufacturing method that includes the following steps (the numbers in the figure correspond to the step numbers):

a) a step of returning a wafer W1 on which a film has been formed in the reaction chamber 7 to the load lock chamber 8;

b) a step of transferring the wafer W1 from the load lock chamber 8 to the mini environment 12 after the load lock chamber 8 is restored to the atmospheric pressure, then to the cooling stage 15 by means of a transfer robot (not illustrated);

c) a step of introducing a next wafer W2 from the wafer storage part 11 to the mini environment 12 and then to the load lock chamber 8 by means of the transfer robot;

d) a step of transferring the wafer W2 from the load lock chamber 8 to the reaction chamber 7 for formation of film on the wafer;

e) a step of transferring the wafer W1 in the cooling stage 15 to the mini-environment 12 and then to the wafer storage part 11 by means of the transfer robot; and f) a step of repeating steps a) through e) for each subsequent wafer.

FIG. 9 shows a wafer transfer sequence involving a cooling stage capable of storing two wafers as proposed in another embodiment. To be specific, this sequence presents a semiconductor manufacturing method that includes the following steps (the numbers in the figure correspond to the step numbers):

a) a step of returning a wafer W1 on which a film has been formed in the reaction chamber 7 to the load lock chamber 8;

b) a step of transferring the wafer W1 from the load lock chamber 8 to the mini environment 12 after the load lock chamber 8 is restored to the atmospheric pressure, and then to the cooling stage 15 by means of a transfer robot (not illustrated);

c) a step of introducing a next wafer W2 from the wafer storage part 11 to the mini environment 12 and then to the load lock chamber 8 by means of the transfer robot;

d) a step of transferring the wafer W2 from the load lock chamber 8 to the reaction chamber 7 for formation of film on the wafer;

e) a step of returning the wafer W2 on which a film has been formed in the reaction chamber 7 to the load lock chamber 8;

f) a step of transferring the wafer W2 from the load lock chamber 8 to the mini environment 12 after the load lock chamber 8 is restored to the atmospheric pressure, and then to the cooling stage 15 by means of the transfer robot;

g) a step of introducing a next wafer W3 from the wafer storage part 11 to the mini environment 12 and then to the load lock chamber 8 by means of the transfer robot;

h) a step of transferring the wafer W3 from the load lock chamber 8 to the reaction chamber 7 for formation of film on the wafer;

i) a step of transferring the wafer W1 in the cooling stage 15 to the mini environment 12 and then to the wafer storage part 11 by means of the transfer robot; and j) a step of repeating steps e) through i) for each subsequent wafer.

FIG. 10 shows a wafer transfer sequence involving a cooling stage capable of storing two wafers as proposed in another embodiment. To be specific, this sequence presents a semiconductor manufacturing method that includes the following steps (the numbers in the figure correspond to the step numbers):

a) a step of introducing an unprocessed wafer W2 from the wafer storage part 11 to the cooling stage 15 by means of a transfer robot (not illustrated);

b) a step of returning a processed wafer W1 on which a film has been formed in the reaction chamber 7 to the load lock chamber 8;

c) a step of transferring the processed wafer W1 from the load lock chamber 8 to the mini environment 12 after the load lock chamber 8 is restored to the atmospheric pressure, and then to the cooling stage 15 by means of the transfer robot;

d) a step of transferring the unprocessed wafer W2 from the cooling stage 15 to the mini environment 12 and to the load lock chamber 8 by means of the transfer robot;

e) a step of transferring the unprocessed wafer W2 from the load lock chamber 8 to the reaction chamber 7 for formation of film on the wafer;

f) a step of introducing a next unprocessed wafer W3 from the wafer storage part 11 to the cooling stage 15 by means of the transfer robot;

g) a step of transferring the processed wafer W1 in the cooling stage 815 to the mini environment 12 and to the wafer storage part 11 by means of the transfer robot; and h) a step of repeating steps b) through g) for each subsequent wafer.

As explained above, using a cooling stage improves the wafer processing capacity and increases the throughput. The reasons are considered as follows (it should be noted that the, present invention is not limited to those accounted for by these reasons). In one embodiment, for example, air may be forcibly supplied to the wafer surface, which improves the heat transfer efficiency on the wafer surface and shortens the cooling time itself. Also, the transfer speed does not have to be limited. Specifically, it takes a shorter time to transfer a wafer to the cooling stage located, for example, immediately above the load lock chamber after film has been formed on the wafer, than to return the wafer directly to the FOUP (wafer cassette). Furthermore, after elapse of a specified time (such as 60 seconds), the wafer stored in the cooling stage can be returned to the FOUP (cassette) whenever the robot is idle. This prevents the transfer speed from being limited.

Next, an example of wafer cooling based on the present invention (by using the cooling stage shown in FIGS. 5A and 5B) is given.

Figure 12:
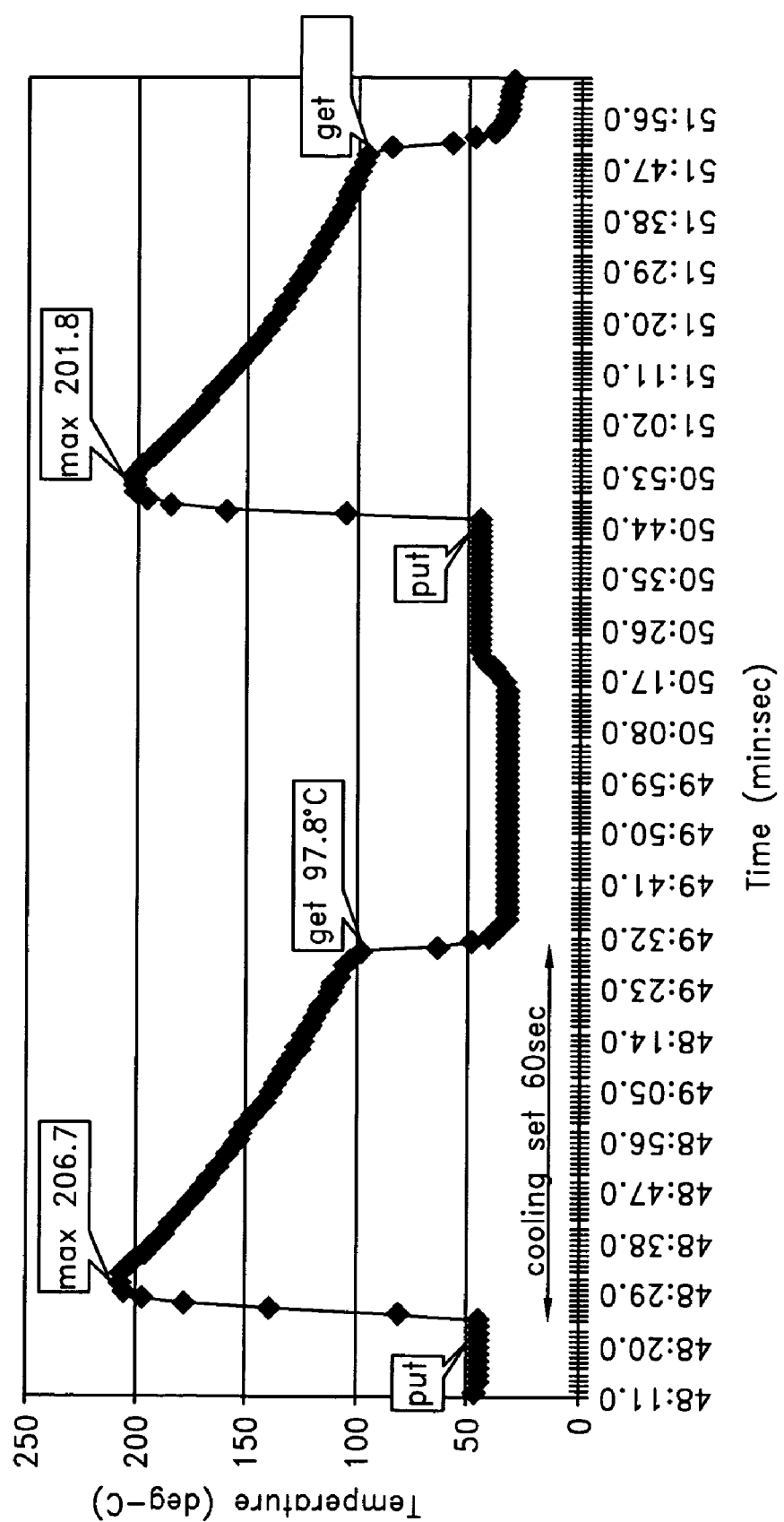
FIG. 12 is a graph showing the trend of wafer temperature in an example of the present invention.

FIG. 12 is a graph showing the trend of wafer temperature in this example. Temperature was measured using a thermocouple (TC) attached near the set plate inside the cooling stage. When a wafer is transferred and placed on the set plate, the back surface of the wafer contacts the TC so that the TC can measure the wafer temperature. This graph starts from "48:11.0." This is the time recorded on the data logger when measurement was started and has no meaning as an absolute value (the time axis of this graph provides a relative scale).

M/E environment:

Temperature (=room temperature): Approx. 25° C.

Air velocity: Approx. 0.5 m/s

Air volume: Approx. 16 m$^3$/m

Pressure: Approx. 4.0 Pa

Cooling stage environment:

Temperature (near the outlet): Approx. 60° C.

Air velocity: Approx. 1.7 m/s

As shown in the graph, at the moment the first wafer was placed in the cooling stage, the TC temperature near the set plate increased and exceeded 200° C. Thereafter, the temperature dropped to 100° C. or below within approx. 60 seconds and the wafer was transferred out of the cooling stage. Thereafter, as the next processed wafer approached the TC near the set plate, the heat of the wafer caused the temperature to increase slightly (50:17 point), and at the moment the aforementioned wafer was placed in the cooling stage, the TC temperature near the set plate increased and exceeded 200° C. Thereafter, the temperature dropped to 100° C. or below within approx. 60 seconds and the wafer was transferred out of the cooling stage. Herein, "put" in the graph indicates a point at which a wafer was physically placed on the set plate and the back surface of the wafer contacted the TC, while "get" indicates a point at which a wafer was physically removed from the set plate and the back surface of the wafer separated from the TC. Therefore, each wafer-cooling curve corresponds to the section between the "max" temperature and "get" temperature.

As shown, according to this example wafers can be cooled efficiently as they are transferred in and out.

Furthermore, as explained above, according to at least one embodiment, the present invention can realize an apparatus and method offering low cost, small footprint, small faceprint and high throughput, and also can realize a semiconductor manufacturing apparatus that embodies high throughput with a level of stability sufficient for use in the manufacturing process.

What is claimed is:

1. A semiconductor manufacturing apparatus comprising:
a reaction chamber;
a transfer chamber connected to said reaction chamber;
a load lock chamber connected to said transfer chamber;
a wafer transfer apparatus comprising:
(A) a mini environment which is defined by walls including a first wall for connecting with an external wafer storage part and a second wall for connecting with an external load lock chamber connected to a reaction chamber opposite the mini environment and which is equipped with a transfer robot inside, in order to transfer a wafer between said wafer storage part and said load lock chamber via the mini environment in the presence of air flows; and
(B) a cooling stage having one end that is connected to the second wall of said mini environment from the outside of said mini environment in the vicinity of a connection port thereof for said load lock chamber and that opens to said mini environment, and another end, opposite to the one end, that is permanently closed with regard to wafer transfer, in order to temporarily support a wafer outside the mini environment, the wafer storage part, and the load lock chamber and guide air to flow from the mini environment through the cooling stage so that the wafer is cooled by the air taken in from said mini environment,
wherein the wafer transfer apparatus is capable of transferring a wafer among said wafer storage part, said load lock chamber, and said cooling stage by said transfer robot, and the wafer transfer apparatus is connected to the load lock chamber; and
the wafer storage part connected to said wafer transfer apparatus,
wherein said transfer chamber is positioned below said reaction chamber.

2. The semiconductor manufacturing apparatus according to claim 1, wherein said reaction chamber and said load lock chamber are positioned on an outer periphery of said transfer chamber.

3. A semiconductor manufacturing method that utilizes a wafer transfer apparatus comprising:
(A) a mini environment that connects a wafer storage part and a load lock chamber and is equipped with a transfer robot inside, in order to transfer a wafer between said wafer storage part and said load lock chamber in the presence of air flows, said load lock chamber being connected to a reaction chamber opposite the mini environment; and
(B) a cooling stage that opens and is connected to said mini environment from the outside of said mini environment in the vicinity of a connection port thereof for said load lock chamber, in order to temporarily hold a wafer so that the wafer is cooled by the air taken in from said mini environment,
wherein the wafer transfer apparatus is capable of transferring a wafer among said wafer storage part, said load lock chamber, and said cooling stage by said transfer robot,
said semiconductor manufacturing method comprising:
a) a step of returning a wafer on which a film has been formed in the reaction chamber to said load lock chamber;
b) a step of transferring said wafer from said load lock chamber to said mini environment after said load lock chamber is restored to the atmospheric pressure, then to said cooling stage by said transfer robot;
c) a step of introducing a next wafer from said wafer storage part to said mini environment and then to said load lock chamber by said transfer robot;
d) a step of transferring said next wafer from said load lock chamber to said reaction chamber for formation of film on the wafer;
e) a step of transferring said wafer in said cooling stage to said mini environment and then to said wafer storage part by said transfer robot; and
f) a step of repeating steps a) through e) for each subsequent wafer.

4. The manufacturing method according to claim 3, further comprising a step of blowing air on a wafer surface in said cooling stage at an air flow rate of at least 1 meter/second.

5. A semiconductor manufacturing method that utilizes a wafer transfer apparatus comprising:
(A) a mini environment that connects a wafer storage part and a load lock chamber and is equipped with a transfer robot inside, in order to transfer a wafer between said wafer storage part and said load lock chamber in the presence of air flows, said load lock chamber being connected to a reaction chamber opposite the mini environment; and
(B) a cooling stage that opens and is connected to said mini environment from the outside of said mini environment in the .vicinity of a connection port thereof for said load lock chamber, in order to temporarily hold a wafer so that the wafer is cooled by the air taken in from said mini environment,
wherein the wafer transfer apparatus is capable of transferring a wafer among said wafer storage part, said load lock chamber, and said cooling stage by said transfer robot, said wafer transfer apparatus being capable of storing two wafers in said cooling stage,
said semiconductor manufacturing method comprising:
a) a step of returning a first wafer on which a film has been formed in the reaction chamber to said load lock chamber;
b) a step of transferring the first wafer from said load lock chamber to said mini environment after said load lock chamber is restored to the atmospheric pressure, and then to said cooling stage by said transfer robot;
c) a step of introducing a second wafer from said wafer storage part to said mini environment and then to said load lock chamber by said transfer robot;
d) a step of transferring said second wafer from said load lock chamber to said reaction chamber for formation of film on the wafer;
e) a step of returning said second wafer on which a film has been formed in the reaction chamber to said load lock chamber;
f) a step of transferring said second wafer from said load lock chamber to said mini environment after said load lock chamber is restored to the atmospheric pressure, and then to said cooling stage by said transfer robot;
g) a step of introducing a third wafer from said wafer storage part to said mini environment and then to said load lock chamber by said transfer robot;
h) a step of transferring said third wafer from said load lock chamber to said reaction chamber for formation of film on the wafer;
i) a step of transferring said first wafer in said cooling stage to said mini environment and then to said wafer storage part by said transfer robot; and
j) a step of repeating steps e) through i) for each subsequent wafer.

6. The manufacturing method according to claim 5, further comprising a step of blowing air on a wafer surface in said cooling stage at an air flow rate of at least 1 meter/second.

7. A semiconductor manufacturing method that utilizes a wafer transfer apparatus comprising:
- (A) a mini environment that connects a wafer storage part and a load lock chamber and is equipped with a transfer robot inside, in order to transfer a wafer between said wafer storage part and said load lock chamber in the presence of air flows, said load lock chamber being connected to a reaction chamber opposite the mini environment; and
- (B) a cooling stage that opens and is connected to said mini environment from the outside of said mini environment in the vicinity of a connection port thereof for said load lock chamber, in order to temporarily hold a wafer so that the wafer is cooled by the air taken in from said mini environment, wherein the wafer transfer apparatus is capable of transferring a wafer among said wafer storage part, said load lock chamber, and said cooling stage by said transfer robot, said wafer transfer apparatus being capable of storing two wafers in said cooling stage, said semiconductor manufacturing method comprising:
- a) a step of introducing an unprocessed wafer from said wafer storage part to said cooling stage by said transfer robot;
- b) a step of returning a processed wafer on which a film has been formed in the reaction chamber to said load lock chamber;
- c) a step of transferring said processed wafer from said load lock chamber to said mini environment after said load lock chamber is restored to the atmospheric pressure, and then to said cooling stage by said transfer robot;
- d) a step of transferring the unprocessed wafer from said cooling stage to the mini environment and then to said load lock chamber by said transfer robot;
- e) a step of transferring said unprocessed wafer from said load lock chamber to said reaction chamber for formation of film on the wafer;
- f) a step of introducing a next unprocessed wafer from said wafer storage part to said cooling stage by said transfer robot;
- g) a step of transferring said processed wafer in said cooling stage to the mini environment and then to said wafer storage part by said transfer robot; and
- h) a step of repeating steps b) through g) for each subsequent wafer.

8. The manufacturing method according to claim 7, further comprising a step of blowing air on a wafer surface in said cooling stage at a air flow rate of at least 1 meter/second.

* * * * *

UNITED STATES PATENT AND TRADEMARK OFFICE
CERTIFICATE OF CORRECTION

PATENT NO. : 7,467,916 B2  
APPLICATION NO. : 11/074820  
DATED : December 23, 2008  
INVENTOR(S) : Yamagishi et al.

Page 1 of 1

It is certified that error appears in the above-identified patent and that said Letters Patent is hereby corrected as shown below:

At Column 6, line 67, change "MIE" to --M/E--, therefore.

At Column 10, line 13, change "the;" to --the--, therefore.

At Column 14, line 27, in Claim 5, change ".vicinity" to --vicinity--, therefore.

Signed and Sealed this

Twenty-first Day of April, 2009

JOHN DOLL  
*Acting Director of the United States Patent and Trademark Office*